United States Patent
Kim et al.

(10) Patent No.: US 7,842,569 B2
(45) Date of Patent: Nov. 30, 2010

(54) FLASH MEMORY DEVICE AND METHOD OF FABRICATING THE SAME

(75) Inventors: Hong-Gun Kim, Gyeonggi-do (KR);
Ju-Seon Goo, Gyeonggi-do (KR);
Mun-Jun Kim, Gyeonggi-do (KR);
Yong-Soon Choi, Gyeonggi-do (KR);
Sung-Tae Kim, Seoul (KR);
Eun-Kyung Baek, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 931 days.

(21) Appl. No.: 11/618,155

(22) Filed: Dec. 29, 2006

(65) Prior Publication Data
US 2008/0035984 A1 Feb. 14, 2008

(30) Foreign Application Priority Data
Aug. 9, 2006 (KR) .................. 10-2006-0075247

(51) Int. Cl.
*H01L 21/00* (2006.01)
(52) U.S. Cl. .................. 438/257; 438/296; 438/435
(58) Field of Classification Search .......... 438/257, 438/296, 435
See application file for complete search history.

(56) References Cited

U.S. PATENT DOCUMENTS

| | | | |
|---|---|---|---|
| 6,274,920 B1 * | 8/2001 | Park et al. | 257/531 |
| 6,551,944 B1 * | 4/2003 | Fallica et al. | 438/719 |
| 6,677,209 B2 * | 1/2004 | Farrar | 438/296 |
| 6,713,365 B2 * | 3/2004 | Lin et al. | 438/424 |
| 7,148,155 B1 * | 12/2006 | Tarafdar et al. | 438/778 |
| 7,541,297 B2 * | 6/2009 | Mallick et al. | 438/778 |
| 7,723,818 B2 * | 5/2010 | Tilke et al. | 257/520 |
| 2005/0074948 A1 * | 4/2005 | Ko et al. | 438/424 |
| 2006/0043456 A1 * | 3/2006 | Derderian et al. | 257/314 |
| 2008/0035984 A1 * | 2/2008 | Kim et al. | 257/316 |
| 2008/0290448 A1 * | 11/2008 | Tilke et al. | 257/513 |
| 2009/0061647 A1 * | 3/2009 | Mallick et al. | 438/773 |

(Continued)

FOREIGN PATENT DOCUMENTS

JP 2006-49915 2/2006

(Continued)

OTHER PUBLICATIONS

English language abstract of Korean Publication No. 10-2004-0059991.

(Continued)

*Primary Examiner*—Laura M Menz
(74) *Attorney, Agent, or Firm*—Myers Bigel Sibley & Sajovec, PA (57) ABSTRACT

One embodiment of a method of fabricating a flash memory device includes forming a trench mask pattern, which includes a gate insulation pattern and a charge storage pattern stacked in sequence, on a semiconductor substrate; etching the semiconductor substrate using the trench mask pattern as an etch mask to form trenches defining active regions; and sequentially forming lower and upper device isolation patterns in the trench. After sequentially forming an intergate insulation film and a control gate film on the upper device isolation pattern, the control gate film, the intergate insulation pattern and the gloating gate pattern are formed, thereby providing gate lines crossing over the active regions.

18 Claims, 6 Drawing Sheets

U.S. PATENT DOCUMENTS

2009/0104755 A1* 4/2009 Mallick et al. .............. 438/477
2009/0104791 A1* 4/2009 Nemani et al. .............. 438/788

FOREIGN PATENT DOCUMENTS

| KR | 2003-0013761 | 2/2003 |
| KR | 10-2004-0059991 | 7/2004 |
| KR | 10-2005-0055074 | 6/2005 |
| KR | 10-2006-0011449 | 2/2006 |
| KR | 10-2006-0046904 | 5/2006 |

OTHER PUBLICATIONS

English language abstract of Korean Publication No. 10-2005-0055074.
English language abstract of Korean Publication No. 10-2006-0011449.
Wolf, Stanley, "Silicon Processing for the VLSI Era: vol. 1—Process Technology," pp. 185-187, 1990 edition, Lattice Press.
Wolf, Stanley, "Silicon Processing for the VLSI Era: vol. 2—Process Integration," pp. 202-203, 1990 edition, Lattice Press.

* cited by examiner

Fig. 1

(CONVENTIONAL ART)

Fig. 2

(CONVENTIONAL ART)

Fig. 3

(CONVENTIONAL ART)

FLASH MEMORY DEVICE AND METHOD OF FABRICATING THE SAME

CROSS-REFERENCE TO RELATED APPLICATIONS

This patent application claims the benefit of foreign priority to Korean Patent Application No. 2006-75247 filed on Aug. 9, 2006, the entire contents of which are hereby incorporated by reference.

BACKGROUND

1. Field of Invention

Embodiments of the present invention described herein generally relate to semiconductor devices such as flash memory devices and methods of fabricating the same.

2. Description of the Related Art

A typical semiconductor device is fabricated by forming device isolation layers to define active regions in predetermined places of a semiconductor substrate and subsequently forming gate electrodes crossing over the active regions. The device isolation layers are generally formed after forming a trench mask pattern using a technique of shallow trench isolation (STI) that anisotropically etches the semiconductor substrate under the trench mask pattern. The gate electrodes are typically formed by depositing a gate insulation film and a gate conductive film in sequence on the active region and patterning the gate conductive film to intersect the active region.

Meanwhile, a nonvolatile memory device such a flash memory device also includes a floating gate electrode placed under the gate electrode. Forming the floating gate electrode is conducted generally using two patterning steps with two mask patterns different from each other (i.e., being arranged in directions parallel and vertical to the active region). In this process for forming the floating gate electrode, a patterning step is performed in the direction vertical to the active region to form the gate electrode. But, in the case of a patterning step in the direction parallel to the active region, an expensive photographic process is additionally needed, and a precise control of photographic processing parameters such as overlay characteristics is needed.

With high integration density of semiconductor devices, it becomes more difficult to regulate the parameters of photographic process. Accordingly, a way of patterning a floating gate conductive film in self-alignment has been proposed for replacing the patterning step based on a photographic process.

Figure 1:
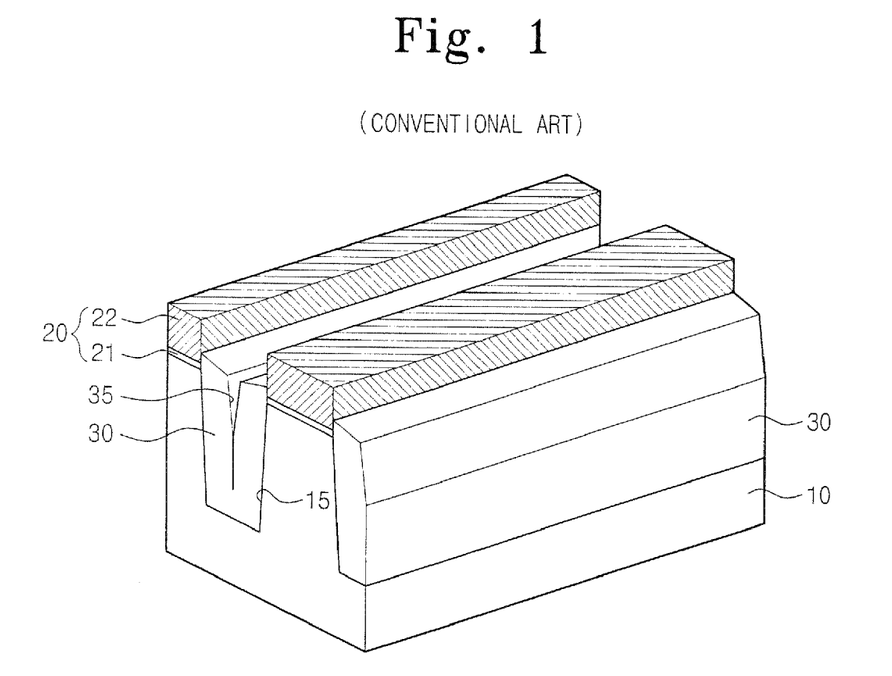
FIGS. 1 through 3 are perspective views showing a conventional method of fabricating a flash memory device.
Figure 2:
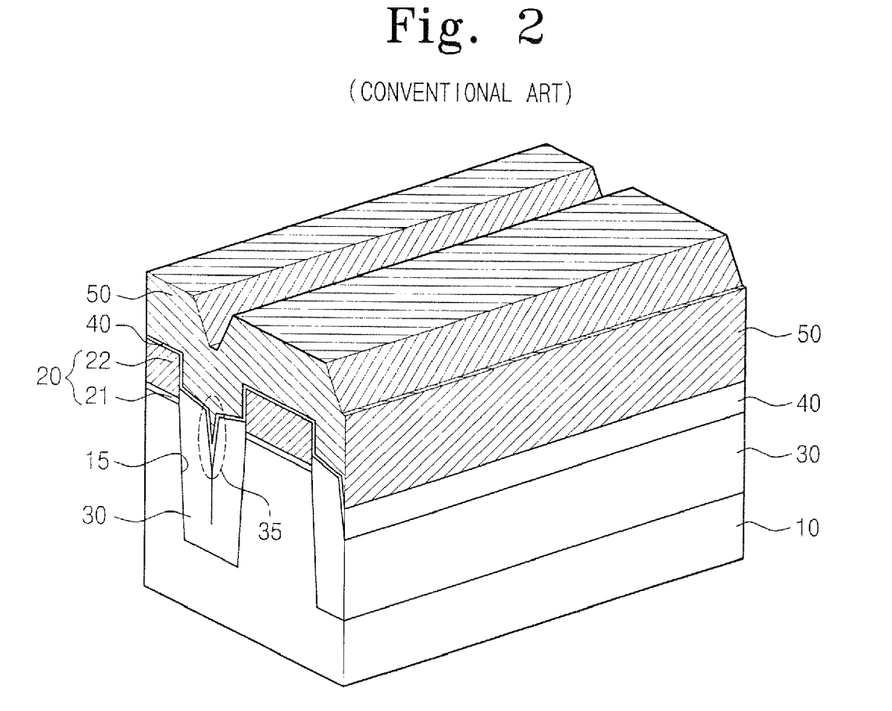
Figure 3:
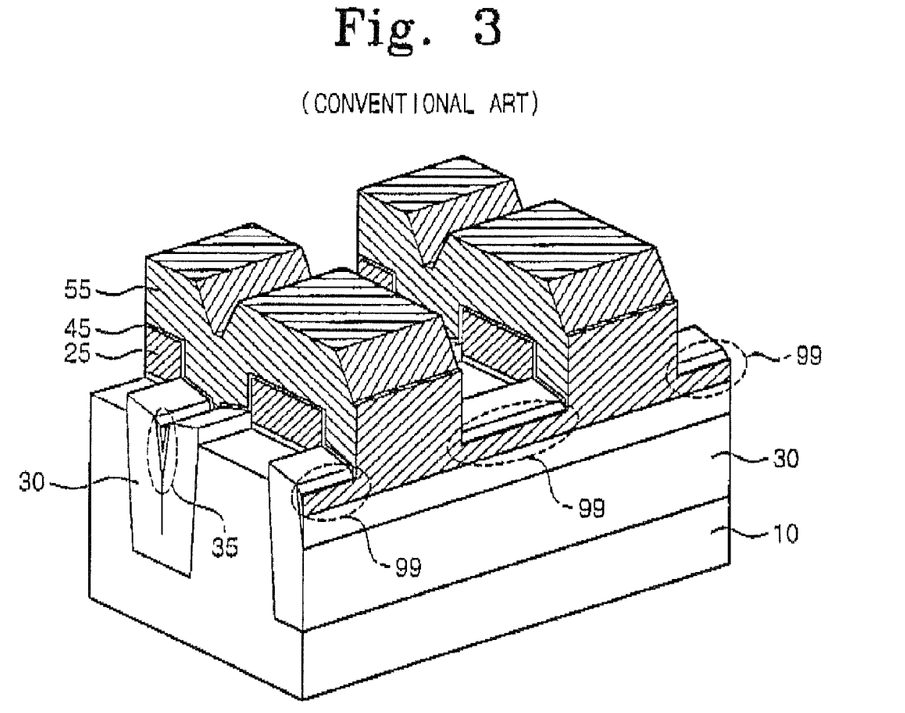

FIGS. 1 through 3 are perspective views showing a general method of fabricating a flash memory device.

Referring to FIG. 1, after forming a trench mask pattern 20 on a semiconductor substrate 10, trenches 15 are formed to define active regions by using the trench mask pattern 20 as an etch mask. Here, the trench mask pattern 20 may include lower and upper mask patterns 21 and 22 which are stacked in sequence. The lower and upper mask patterns, 21 and 22, are each used as a gate insulation film and a floating gate electrode in a memory transistor of the flash memory device.

Next, a device isolation pattern 30 is formed to fill the trenches 15. The device isolation pattern 30 is formed by forming a device isolation layer to fill the trenches 15 and etching the device isolation layer to expose the upper sidewalls of the upper mask pattern 22. In this conventional art, the device isolation layer may be a silicon oxide film formed by chemical vapor deposition (CVD). But, as well known, when a gap region (e.g., the trench 15) with a large aspect ratio is filled up with a layer form by CVD, discontinuous interfaces or voids are generated due to the step coverage characteristics of the CVD layer (see "Silicon Processing for the VLSI Era: Volume 1—Process Technology" written by Stanley Wolf, pp. 185 of 1990 edition, Lattice Press, and "Silicon Processing for the VLSI Era: Volume 2—Process Integration" written by Stanley Wolf, pp. 202 of 1990 edition by Lattice Press). As the device isolation pattern 30 is formed by etching the device isolation layer including the discontinuous interfaces or voids, a seam 35 is formed at the upper center of the device isolation pattern 30 as shown in FIG. 1.

Referring to FIG. 2, an intergate insulation film 40 and a control gate film 50 are sequentially deposited on the resultant structure including the device isolation pattern 30. Referring to FIG. 3, the intergate insulation film 40, the control gate film 50, and the upper mask pattern 22 are patterned to form gate lines crossing over the active regions. The gate line is composed of an intergate insulation pattern 45, a control gate electrode 55, and a floating gate electrode 25 interposed between the intergate insulation pattern 45 and the active region, which are sequentially stacked with crossing over the active regions.

As shown in FIG. 3, the intergate insulation film 40 and the control gate film 50 may be formed to fill the seam 35, But, the control gate film 50 formed in the seam 35 may remain therein without being etched away clearly. Such remaining portions of the control gate film 50 in the seam 35 can act as electrical paths 99 causing undesirable bridges between adjacent gate lines and, as a result, yield a defective product.

SUMMARY

Embodiments of the present invention provide a method of fabricating a semiconductor device such as a flash memory device capable of preventing bridges between adjacent gate lines. Embodiments of the present invention also provide flash memory devices capable of preventing bridges between adjacent gate lines.

One embodiment exemplarily described herein can be characterized as a method of fabricating a flash memory device that includes forming a trench mask pattern, the trench mask pattern comprising a gate insulation pattern and a charge storage pattern; etching the semiconductor substrate using the trench mask pattern as an etch mask thereby forming trenches defining active regions; sequentially forming a lower isolation pattern and an upper device isolation pattern in the trench; sequentially forming an intergate insulation film and a control gate film on the upper device isolation pattern; and patterning the control gate film, the intergate insulation film and the charge storage pattern to form gate lines crossing over the active regions.

In one embodiment, the lower device isolation pattern may be formed by forming a lower device isolation layer to fill the trench and etching the lower device isolation layer until exposing upper sidewalls of the trench. During this process, the lower device isolation layer may include silicon oxide and be formed by a process such as chemical vapor deposition. Further, the lower device isolation layer may be formed by a process in which successive steps of film deposition and etching are performed at least once.

In one embodiment, the structure including the lower device isolation layer may be thermally treated at a temperature of about 500° C. to about 900° C. before forming the upper device isolation pattern. The thermal treatment may be carried out in an ambient containing at least one of nitrogen, argon, oxygen, and water vapor under pressure of about 10 Torr to about 760 Torr.

In one embodiment, the upper device isolation pattern can be formed by forming an upper device isolation layer on the lower device isolation pattern and etching the upper device isolation layer until upper sidewalls of the trench mask pattern are exposed. The upper device isolation layer may include a high-density plasma silicon oxide film. The high-density plasma silicon oxide film may be formed according to a high-density plasma deposition process whereby film deposition and etching are simultaneously conducted. The high-density plasma deposition process may use processing gas with at least one of helium and hydrogen.

In one embodiment, a thermal oxide film may be formed on an inner wall of the trench by means of thermal oxidation before forming the lower device isolation pattern. In addition, a nitride liner may be further formed on the thermal oxide film before forming the lower device isolation pattern.

In one embodiment, the gate line may include a charge storage electrode, an intergate insulation pattern and a control gate electrode, which are stacked in sequence. The intergate insulation pattern and the control gate electrode are stacked in sequence and cross over the active regions. The charge storage electrode is interposed between the active region and the intergate insulation pattern. Further, the intergate insulation pattern directly contacts the upper device isolation pattern over the trench.

In one embodiment, the charge storage electrode includes polysilicon and the intergate insulation pattern includes at least one of silicon oxide, silicon nitride, silicon oxynitride, and high-dielectric material. The control gate electrode includes at least one of polysilicon, metal silicide, and metal.

In one embodiment, the charge storage pattern, after being used as an etch mask in forming the trench, turns into the charge storage electrode while forming the gate line.

In one embodiment, spacers may be further formed on both sidewalls of the trench mask pattern before forming the intergate insulation film. In this case, the upper device isolation pattern may be etched using the spacers as an etch mask, thereby forming a recess region before forming the intergate insulation film. A bottom surface of the recess region may be lower than a bottom surface of the spacers and higher than a top surface of the lower device isolation pattern.

Another embodiment exemplarily described herein can be characterized as a flash memory device that includes a semiconductor substrate including trenches defining active regions; lower and upper device isolation patterns disposed in the trench; an intergate insulation pattern and a control gate electrode disposed on the semiconductor substrate to cross over the active regions; a charge storage electrode between the control gate electrode and the active region; and a gate insulation pattern between the charge storage electrode and the active region, wherein the intergate insulation patter directly contacts the upper device isolation pattern between the active regions.

In one embodiment, the lower device isolation pattern may include silicon oxide formed by a chemical vapor deposition process, and the upper device isolation pattern may include silicon oxide formed by a high-density plasma deposition process. Further, the lower device isolation pattern includes a discontinuous interface extending toward a bottom of the trench from a top center of the lower device isolation pattern, and the upper device isolation pattern covers the discontinuous interface of the lower device isolation pattern.

In one embodiment, spacers may be disposed at both sidewalls of the charge storage electrode under the intergate insulation pattern. Here, the spacers expose a top surface of the upper device isolation pattern. In addition, the upper device isolation pattern may include a recess region formed between the spacers. In this case, a bottom of the recess region is leveled lower than a bottom of the spacers and higher than a top of the lower device isolation pattern.

Still another embodiment exemplarily described herein can be characterized as a memory device that includes a semiconductor substrate including trenches defining active regions; a lower device isolation pattern in the trench, wherein a void is defined within the lower device isolation pattern; an upper device isolation pattern in the trench and on the lower device isolation pattern, wherein the upper device isolation pattern extends substantially contiguously between the active regions from an upper surface of the upper device isolation pattern to a lower surface of the upper device isolation pattern; an intergate insulation pattern and a control gate electrode disposed on the semiconductor substrate to cross over the active regions; a charge storage electrode between the control gate electrode and the active region; and a gate insulation pattern between the charge storage electrode and the active region.

A further understanding of the nature and advantages of the present invention herein may be realized by reference to the remaining portions of the specification and the attached drawings.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION

Embodiments of the present invention will be exemplarily described below in more detail with reference to the accompanying drawings. These embodiments may, however, be realized in different forms and should not be constructed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

Moreover, the description hereinbelow uses terms of first, second, or third for representing pluralities of various regions or films, those terms are employed to differentiate one from another, not restrictive thereto. In a certain case, a first region or film may be referred to as a second region or film in another embodiment. And, embodiments described herein may include their complementary cases. In the figures, like reference numerals refer to like elements throughout.

Hereinafter, it will be described about an exemplary embodiment of the present invention in conjunction with the accompanying drawings.

FIGS. 4-11 are perspective views illustrating one embodiment of a method of fabricating a flash memory device.

Figure 4:
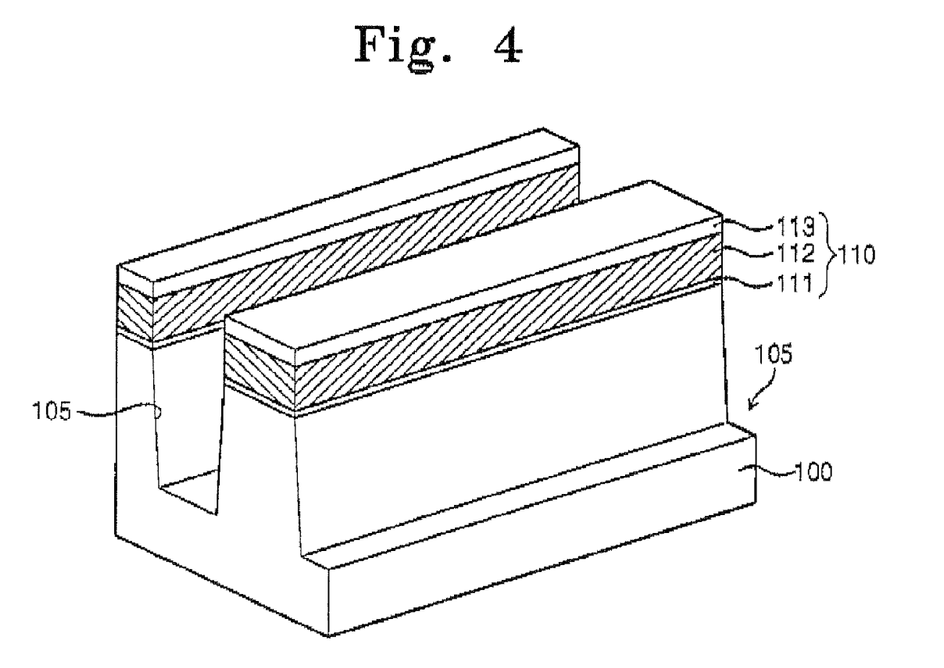
FIGS. 4-11 are perspective views illustrating one embodiment of a method of fabricating a flash memory device.

Referring to FIG. 4, after arranging trench mask patterns 110 on a semiconductor substrate 100, the semiconductor substrate 100 is anisotropically etched by using the trench mask patterns 110 as an etch mask, forming trenches 105 to confine active regions.

According to one embodiment, the trench mask pattern 110 includes first and second trench mask films 111 and 112. Here, the first trench mask film 111 may include a material such as silicon oxide formed, for example, by thermal oxidation and the second trench mask film 112 may include a material such as polysilicon. As illustrated, the first and second trench mask films, 111 and 112, remain after forming the trenches 105 so that they may be used as a gate insulation film and a charge storage film (e.g., a floating gate film) for cell transistors of a subsequently formed flash memory device.

According to another embodiment, the trench mask pattern 110 may further include a third trench mask film 113 on the second trench mask film 112. The third trench mask film 113 may include a material such as silicon nitride. According to still another embodiment, the trench mask pattern 110, which includes silicon oxide and nitride materials, may be made up with the first and third trench mask films 111 and 113. In this case, the trench mask pattern 110 may be removed after the etching process for making the trenches 105.

Forming the trenches 105 can be carried out by anisotropically etching the semiconductor substrate 100 using an etch recipe having selectivity to the trench mask pattern 110. As a result, the active regions correspond with the area under the trench mask patterns 110 and the trenches 105 are formed between the trench mask patterns 110.

Figure 5:
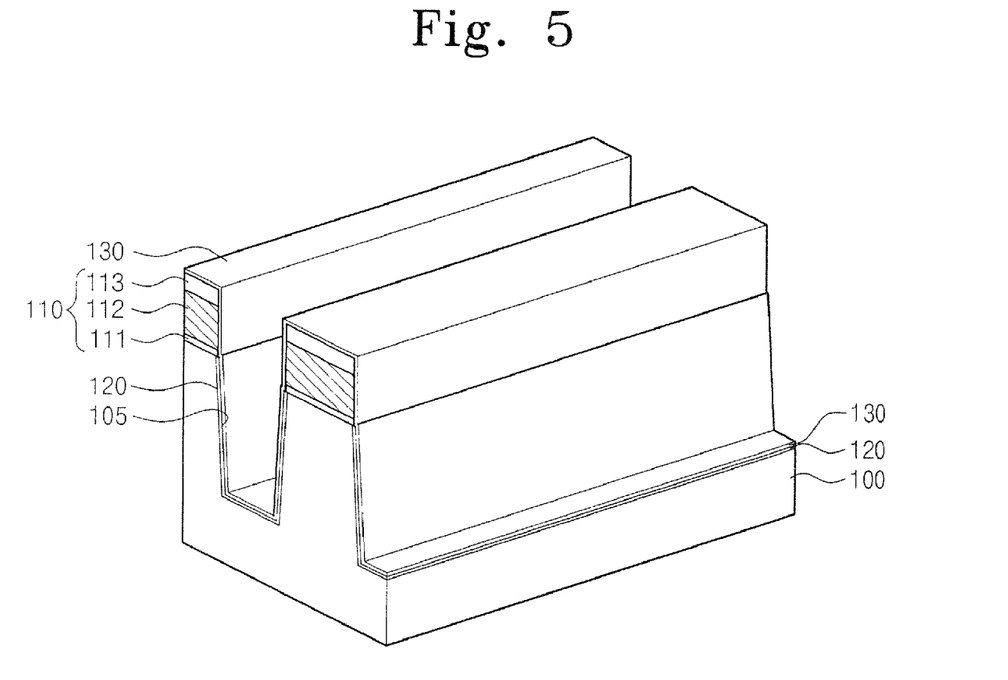

Referring to FIG. 5, a process of thermal oxidation is carried out on the resultant structure including the trenches 105, thereby forming a thermal oxide film 120 on the inner walls of the trenches 105. This thermal oxidation contributes to curing physical damages that would be generated on the inner walls during the former anisotropic etching process.

According to one embodiment, a silicon nitride film 130 is conformably formed on the resultant structure including the thermal oxide film 120. As well known, since the silicon nitride film 130 is formed in high density, it acts to intercept impurities from penetrating through the active regions used for channel regions of transistors. During formation of the silicon nitride Film 130, the thermal oxide film 120 blocks a direct contact between the silicon nitride film 130 and the semiconductor substrate 100, thereby lessening stress due to a difference of thermal coefficient coefficients.

Figure 6:
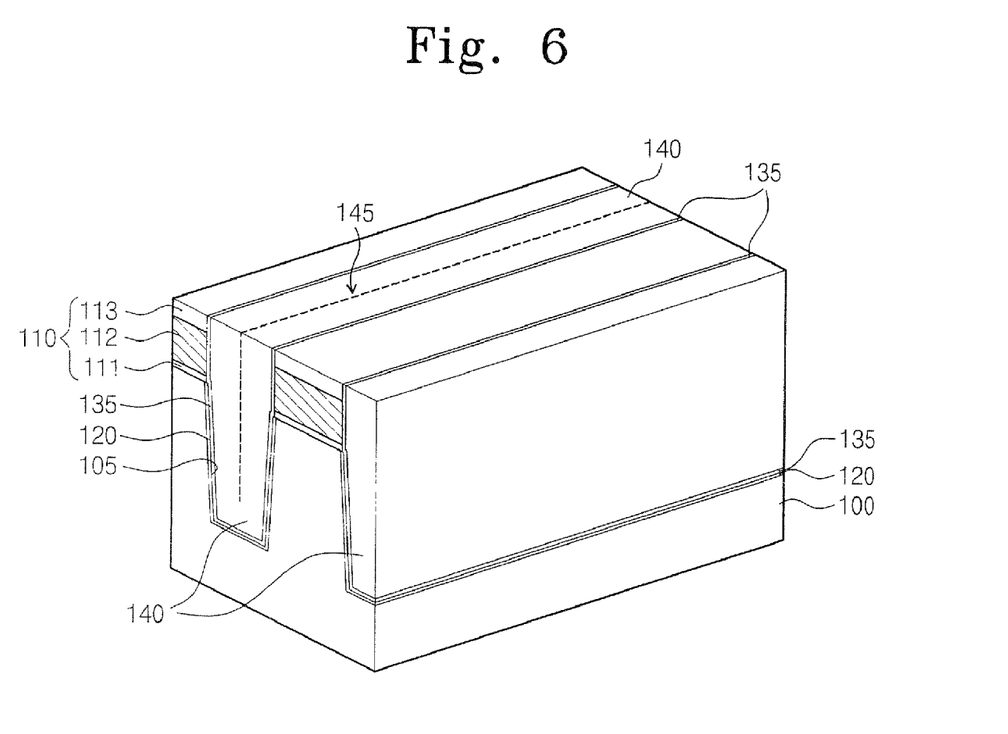

Next, referring to FIG. 6, a lower device isolation layer is formed on the resultant structure including the silicon nitride film 130 by filling the trenches 105. The lower device isolation layer may include a material such as silicon oxide and be formed according to a method such as CVD. According to one embodiment, the lower device isolation layer may be formed in a single vapor deposition step. According to another embodiment, the lower device isolation layer may be formed in successive vapor deposition and etching steps, which may be repeated as desired.

In the meantime, as well known, when a gap region (e.g., the trench 105) with a large aspect ratio is filled up with a film by means of CVD, a discontinuous interface 145 (e.g., a void, a seam, etc.) is generated, as shown in FIG. 6, due to the step coverage characteristics of such a CVD film. If the step coverage characteristics become too poor, voids (not shown) are formed by overhangs generated in the gap region.

The lower device isolation layer is etched using the trench mask patterns 10 as an etch mask to form lower device isolation patterns 140 exposing sidewalls of the trench mask patterns 110. The lower device isolation patterns 140 may be formed by etching and flattening (or planarizing) the lower device isolation layer until the top surfaces of the trench mask patterns 110 is exposed. A chemical-mechanical polishing (CMP) technique may be used for the planarization process. Subsequently, the silicon nitride film 130 is etched to form a nitride liner 135 interposed between the trench mask pattern 110 and the lower device isolation pattern 140.

Figure 7:
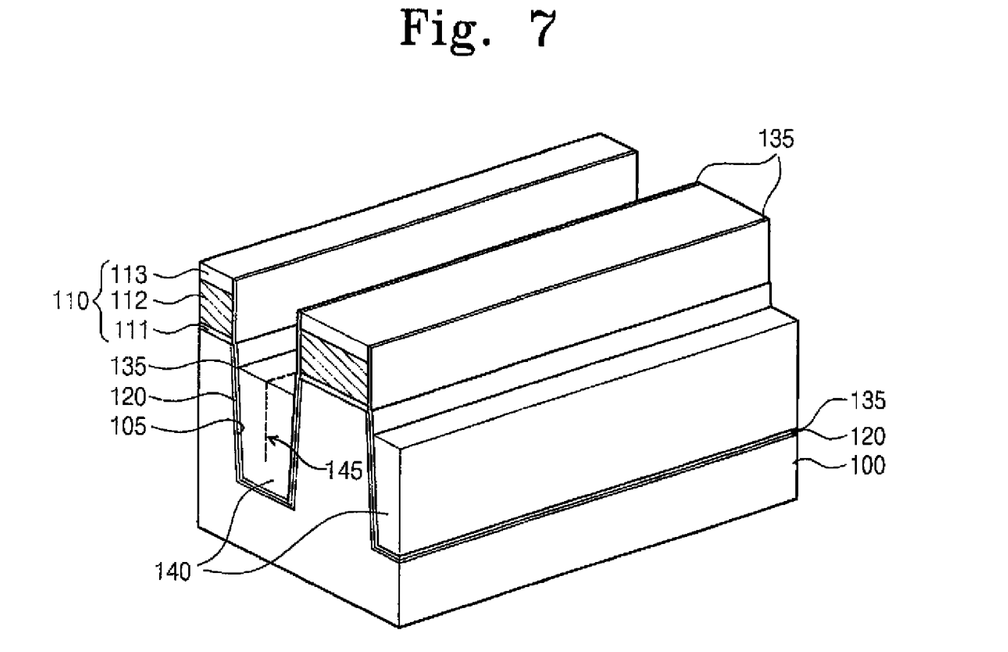

Referring to FIG. 7, the lower device isolation layer is further etched to form a lower device isolation pattern 140 having an upper surface that is lower than an upper surface of the active region. Accordingly, the lower device isolation pattern 140 may have an upper surface that is substantially planar. During the further etching process, the lower device isolation pattern 140 still contains the discontinuous interface 145 extending toward the bottom of the trench 105.

As mentioned above, the third trench mask film 113 and the nitride liner 135 may include a material such as silicon nitride. In this case, the third trench mask film 113 and the nitride liner 135 have an etching selectivity to the lower device isolation pattern 140. The nitride liner 135 may be used as an etch mask, along with the trench mask pattern 110, for preventing damages during the etching process to form the lower device isolation patterns 140.

According to one embodiment, a thermal treatment may be carried out on the resultant structure including the lower device isolation patterns 140. This thermal treatment may be conducted in a gas ambient containing at least one of nitrogen ($N_2$), argon (Ar), oxygen ($O_2$), and water vapor ($H_2O$), with the temperature of about 500° C. to about 900° C., under a pressure of about 10 Torr to about 760 Torr. The lower device isolation pattern 140 may be densified upon performing the thermal treatment.

Figure 8:
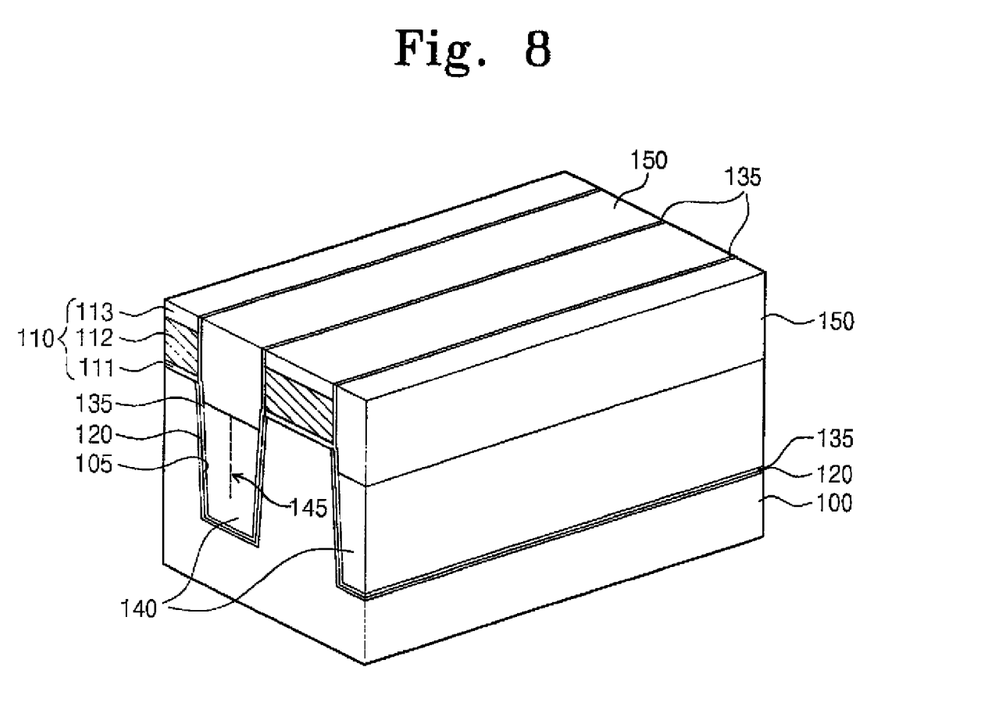

Referring to FIG. 8, an upper device isolation layer 150 is formed on the resultant structure including the lower device isolation patterns 140. According to one embodiment, the upper device isolation layer 150 may include a material such as an oxide and be formed according to a high-density plasma (HDP) deposition process. A CMP process is then carried out to etch the upper device isolation layer 150 and expose the tops of the trench mask patterns 110.

In the aforementioned HDP process, film deposition occurs simultaneously with etching of the film, but the deposition rate is faster than the etching rate. Because film deposition occurs simultaneously with etching of the film, HDP processes are different from alternately conducting the film deposition and etching steps (i.e., the process used to form the lower device isolation layer). Moreover, because film deposition and etching steps of HDP processes are carried out in the same reaction chamber, HDP processes are differentiated from processes of forming the lower device isolation layer by alternately conducting film deposition and etching steps in different reaction chambers. Due the manner in which the HDP oxide layer is formed, the upper device isolation layer 150 does not have a discontinuous interface generating seams. Such a structure is different from the lower device isolation pattern 140.

During the HDP process, depositing and sputtering gases for depositing and etching the upper device isolation layer 150 flow into the same chamber. According to one embodiment, the depositing gas may contain at least one of silane (SiH$_4$) gas, disilane (Si$_2$H$_4$) gas, and oxygen gas. The sputtering gas may contain at least one of hydrogen gas, helium gas, and argon gas.

According to another embodiment, the upper device isolation layer 150 may be formed by repeating the HDP process several times. In this case, the step of etching the upper device isolation layer 150 may be carried out after completing the HDP process.

Figure 9:
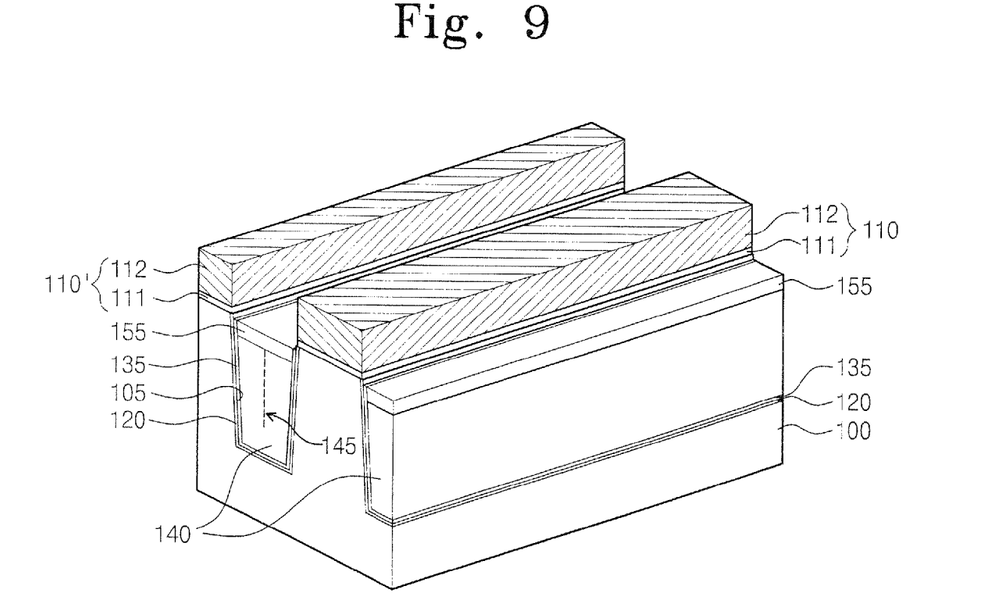

Referring to FIG. 9, using the trench mask pattern 110 (i.e., the third trench mask film 113) and the nitride liner 135 as an etch mask, the upper device isolation layer 150 is selectively etched to form upper device isolation patterns 155 on the lower device isolation patterns 140. Because the upper device isolation layer 150 was subject to a CMP process, an upper surface of the upper device isolation pattern 155 may be substantially planar.

According to one embodiment, an upper surface of the upper device isolation pattern 155 may be lower than the second trench mask film 112 and higher than the first trench mask film 111. According to another embodiment, an upper surface of the upper device isolation pattern 155 may be lower than the upper surface of the active region (as shown in FIG. 9).

The third trench mask film 113 is then removed by means of an etching recipe having selectivity to the upper device isolation pattern 155. The etching step for removing the third trench mask film 113 may be carried out by a technique such as wet etching. During this, sidewalls of the nitride liner 135, which are exposed on the upper device isolation patterns 155, may be removed along with the third trench mask film 113.

Figure 10:
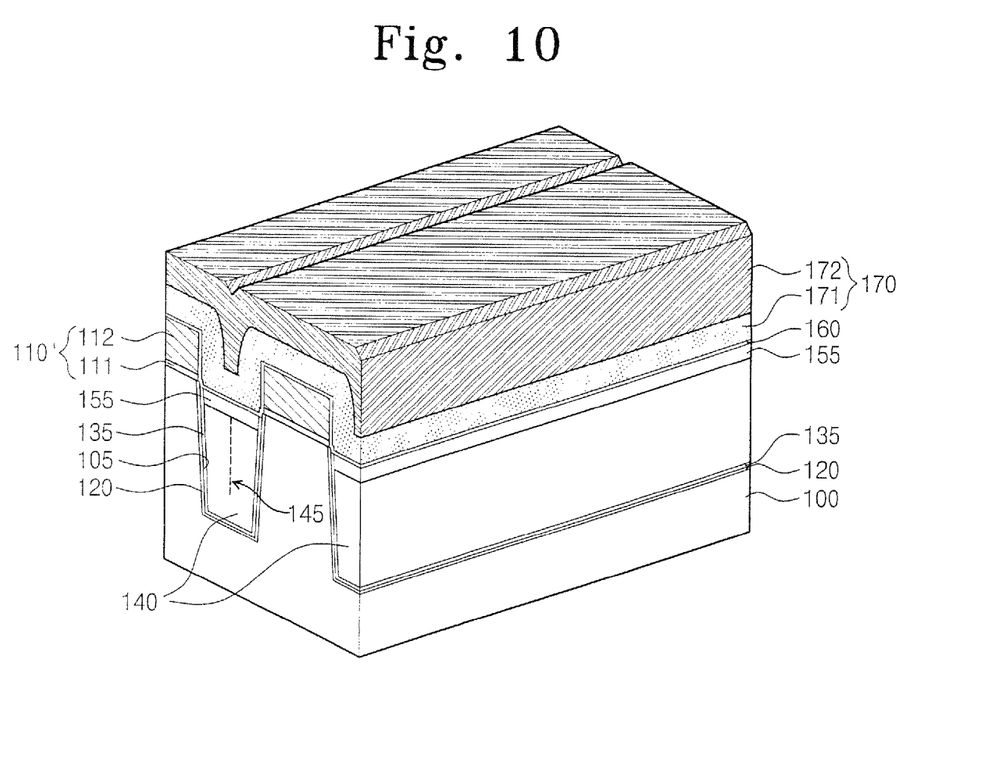

Referring to FIG. 10, an intergate insulation film 160 and a control gate film 170 are then deposited in sequence on the resultant structure including the upper device isolation patterns 155. As a result, the intergate insulation film 160 directly contacts the upper device isolation patterns 155 in the trenches 105.

According to one embodiment, the intergate insulation film 160 includes at least one of a silicon oxide, a silicon nitride, a silicon oxynitride and a high-dielectric layer. The control gate film 170 includes at least one of a polysilicon, a metal silicide and a metal layer. For instance, the intergate insulation film 160 may include a silicon oxide layer, a silicon nitride layer and a silicon oxide layer stacked in sequence. The control gate film 170 may, for example, include lower and upper control gate films 171 and 172 which are stacked in sequence. The lower control gate film 171 may include, for example, polysilicon while the upper control gate film 172 may include, for example, tungsten silicide.

Figure 11:
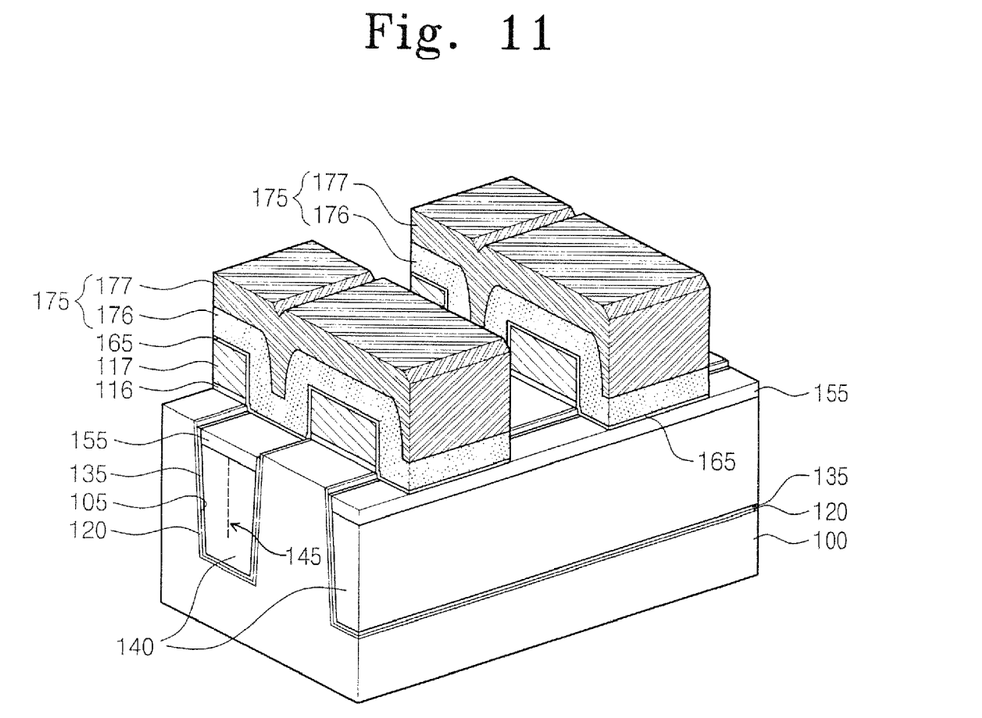

Referring to FIG. 11, the control gate film 170, the intergate insulation film 160 and the first and second trench mask films 111 and 112, respectively, are patterned to form gate lines crossing over the active regions. Namely, the gate line is formed of a charge storage electrode 117 (e.g., a floating gate electrode), an intergate insulation pattern 165, and a control gate electrode 175 which are stacked in sequence. The first trench mask film 111 is patterned to form gate insulation film 116. Forming the gate lines can be carried out by anisotropically etching the control gate film 170 with an etch recipe having a selectivity to the intergate insulation film 165, etching the intergate insulation film 150 to expose the second trench mask film 112 and then anisotropically etching the second trench mask film 112 with an etch recipe having a selectivity to silicon oxide.

During this, the charge storage electrode 117 is formed by patterning the second trench mask film 112, previously used as the etch mask for the trenches, and is self-aligned on the active region. The intergate insulation patterns 165 cross over the active regions and the upper device isolation patterns 155, covering the top and sidewalls of the charge storage electrode 117. Because the upper device isolation patterns 155 contact both the intergate insulation patterns 165 and the lower device isolation patterns 140, it is possible to prevent technical problems caused by the discontinuous interface 145 of the lower device isolation patterns 140. The control gate electrode 175 results from patterning the lower and upper gate films 171 and 172, being composed of lower and upper control gate electrodes 176 and 177.

Figure 12:
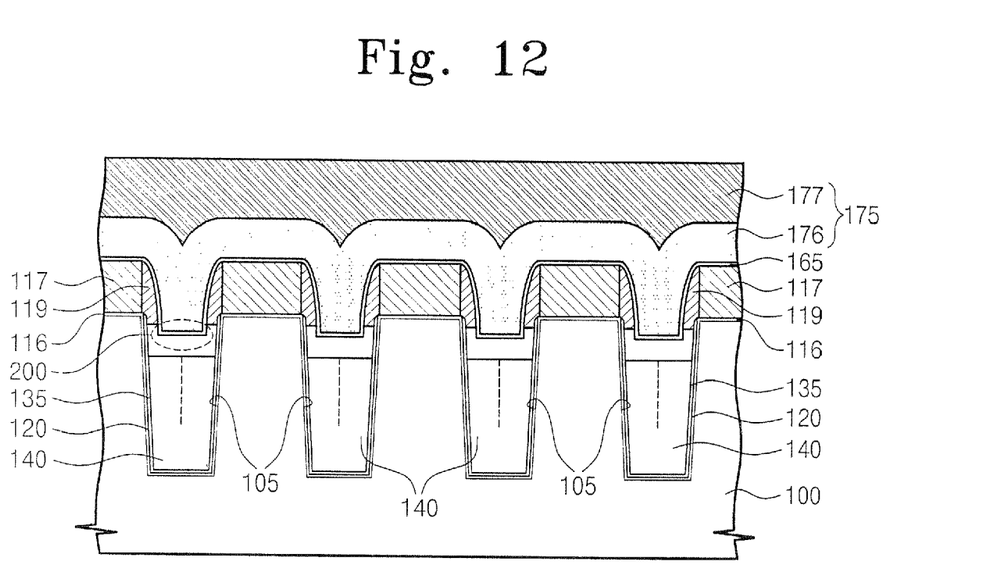
FIG. 12 is a sectional view illustrating an exemplary embodiment of a flash memory device.

FIG. 12 is a sectional view illustrating an exemplary embodiment of a flash memory device.

Referring to FIGS. 9 and 12, before forming the intergate insulation film 160, spacers 119 may be formed at both sidewalls of trench mask patterns 110'. The spacers 119 may be formed on the resultant structure including the upper device isolation patterns 155. Next, using the spacers 119 and the trench mask patterns 110' as an etch mask, the exposed top surfaces of the device isolation patterns 155 are etched to form recess regions 200 having a bottom surface lower than the top surfaces of the active regions.

The subsequent processing steps after forming the recess regions 200 are same as those exemplarily described above with respect to FIGS. 4-11. Forming the recess regions 200 as shown in FIG. 12 allows the control gate electrode 175 to be extended toward the bottoms of the trenches 105. This extended control gate electrode 175 can be used as a shielding layer, contributing to reducing electrical interference between adjacent memory cells.

As described above, the HDP process is used to form the upper device isolation pattern on the lower device isolation pattern, formed by CVD. Thus, the upper device isolation pattern extends substantially contiguously between the active regions from an upper surface thereof to a lower surface thereof. Thus, the seam generable at the upper center of the lower device isolation pattern is covered by the upper device isolation pattern and bridges between adjacent gate lines, which would otherwise be generated by filling the seam with the intergate insulation film and the control gate film as discussed above with respect to FIGS. 1-3, can be prevented.

By forming the charge storage electrode in self-alignment, an aspect ratio of a gap region made by the trench mask patterns and the trenches increases to deepen the problems due to the gate bridges and the seam. But, those technical problems can be prevented effectively by the present invention that provides the way of covering the seam by the HDP film.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of fabricating a semiconductor device, the method comprising:
   forming a trench mask pattern that includes a gate insulation pattern and a charge storage pattern on a semiconductor substrate;
   etching the semiconductor substrate, using the trench mask pattern as an etch mask, thereby forming trenches defining active regions;
   forming a lower device isolation pattern in the trench, the lower device isolation pattern having a discontinuous interface that is extended downwardly from a surface of the lower device isolation pattern toward a surface of the semiconductor substrate;

forming an upper device isolation pattern that is free of discontinuous interfaces and that covers the discontinuous interface of the lower device isolation pattern;

sequentially forming an intergate insulation film and a control gate film on the upper device isolation pattern; and patterning the control gate film, the intergate insulation film and the charge storage pattern to form gate lines crossing over the active regions.

2. The method as set forth in claim 1, wherein the charge storage pattern comprises a floating gate pattern.

3. The method as set forth in claim 1, wherein forming the lower device isolation pattern comprises:

forming a lower device isolation layer to fill the trench; and etching the lower device isolation layer until upper sidewalls of the trench are exposed.

4. The method as set forth in claim 3, wherein the lower device isolation layer includes silicon oxide formed according to a chemical vapor deposition process.

5. The method as set forth in claim 3, wherein forming the lower device isolation layer comprises successively performing film deposition and etching.

6. The method as set forth in claim 3, further comprising, before forming the upper device isolation pattern, thermally treating the lower device isolation layer at a temperature of about 500° C. to about 900° C. in gas ambient containing at least one of nitrogen, argon, oxygen, and water vapor under pressure of about 10 Torr to about 760 Torr.

7. The method as set forth in claim 1, wherein forming the upper device isolation pattern comprises:

forming an upper device isolation layer on the lower device isolation pattern; and etching the upper device isolation layer until upper sidewalls of the trench mask pattern are exposed.

8. The method as set forth in claim 7, wherein the upper device isolation layer includes a high-density plasma silicon oxide film.

9. The method as set forth in claim 7, wherein forming the upper device isolation layer comprises simultaneously performing film deposition and etching according to a high-density plasma deposition process, wherein the high-density plasma deposition process uses at least one of helium and hydrogen as a processing gas.

10. The method as set forth in claim 1, further comprising, before forming the lower device isolation pattern, performing a thermal oxidation process to form a thermal oxide film on an inner wall of the trench.

11. The method as set forth in claim 10, further comprising, before forming the lower device isolation pattern, forming a nitride liner on the thermal oxide film.

12. The method as set forth in claim 1, wherein the gate line comprises a sequentially stacked charge storage electrode, an intergate insulation pattern and a control gate electrode, wherein the intergate insulation pattern and the control gate electrode are sequentially stacked and cross over the active regions and wherein the charge storage electrode is interposed between the active region and the intergate insulation pattern.

13. The method as set forth in claim 12, wherein the intergate insulation pattern directly contacts the upper device isolation pattern over the trench.

14. The method as set forth in claim 12, wherein the charge storage electrode comprises polysilicon, wherein the intergate insulation pattern comprises at least one of silicon oxide, silicon nitride, silicon oxynitride, and high-dielectric material and wherein the control gate electrode comprises at least one of polysilicon, metal silicide, and metal.

15. The method as set forth in claim 12, further comprising forming the trench using the charge storage pattern as an etch mask and patterning the charge storage pattern to form the charge storage electrode.

16. The method as set forth in claim 1, further comprising, before forming the intergate insulation film, forming spacers on sidewalls of the trench mask pattern.

17. The method as set forth in claim 16, further comprising, before forming the intergate insulation film, etching the upper device isolation pattern using the spacers as an etch mask to form a recess region, wherein a bottom surface of the recess region is lower than a bottom surface of the spacers and higher than a top surface of the lower device isolation pattern.

18. The method as set forth in claim 1, wherein the lower device isolation pattern is planarized without eliminating the discontinuous interface therein.

* * * * *